(12) United States Patent
Hildebrant et al.

(10) Patent No.: US 7,404,109 B2
(45) Date of Patent: Jul. 22, 2008

(54) SYSTEMS AND METHODS FOR ADAPTIVELY COMPRESSING TEST DATA

(75) Inventors: Andrew S. Hildebrant, Loveland, CO (US); Domenico Chindamo, Rome (IT)

(73) Assignee: Verigy (Singapore) Pte. Ltd., Singapore (SG)

( * ) Notice: Subject to any disclaimer, the term of this patent is extended or adjusted under 35 U.S.C. 154(b) by 622 days.

(21) Appl. No.: 10/736,438

(22) Filed: Dec. 15, 2003

(65) Prior Publication Data

US 2004/0255215 A1 Dec. 16, 2004

Related U.S. Application Data

(63) Continuation-in-part of application No. 10/620,191, filed on Jul. 15, 2003, and a continuation-in-part of application No. 10/461,252, filed on Jun. 12, 2003, now Pat. No. 7,100,098.

(51) Int. Cl.
 G11B 20/20 (2006.01)
(52) U.S. Cl. ..................................................... 714/700
(58) Field of Classification Search ................. 714/738, 714/736, 724, 743
 See application file for complete search history.

(56) References Cited

U.S. PATENT DOCUMENTS

| | | | | |
|---|---|---|---|---|
| 5,467,087 A | * | 11/1995 | Chu | 341/51 |
| 5,499,248 A | * | 3/1996 | Behrens et al. | 714/724 |
| 5,737,512 A | | 4/1998 | Proudfoot et al. | |
| 5,883,906 A | * | 3/1999 | Turnquist et al. | 714/738 |
| 6,067,651 A | | 5/2000 | Rohrbaugh et al. | |
| 6,205,407 B1 | * | 3/2001 | Testa et al. | 702/119 |
| 6,327,687 B1 | * | 12/2001 | Rajski et al. | 714/738 |
| 6,546,512 B1 | * | 4/2003 | Ochoa et al. | 714/724 |
| 6,560,756 B1 | * | 5/2003 | Necoechea et al. | 716/4 |
| 6,661,839 B1 | * | 12/2003 | Ishida et al. | 375/240 |
| 6,732,312 B2 | | 5/2004 | Khoche et al. | |
| 6,751,767 B1 | * | 6/2004 | Toumiya | 714/738 |
| 6,795,944 B2 | * | 9/2004 | Barnhart | 714/726 |
| 6,950,974 B1 | * | 9/2005 | Wohl et al. | 714/733 |
| 2003/0217343 A1 | * | 11/2003 | Rajsuman et al. | 716/4 |
| 2004/0237014 A1 | * | 11/2004 | Bhatia | 714/726 |
| 2005/0097419 A1 | * | 5/2005 | Rajski et al. | 714/742 |
| 2006/0242502 A1 | * | 10/2006 | Wang et al. | 714/724 |

\* cited by examiner

Primary Examiner—Jacques Louis-Jacques
Assistant Examiner—Sam Rizk
(74) Attorney, Agent, or Firm—Holland & Hart, LLP

(57) ABSTRACT

Systems and methods for adaptively compressing test data are disclosed. One such method comprises the steps of examining a test data file that includes a first plurality of data units corresponding to a first plurality of DUT pins and a second plurality of data units corresponding to a second plurality of DUT pins, compressing the first plurality of data units using a first compression technique, and compressing the second plurality of data units using a second compression technique.

8 Claims, 16 Drawing Sheets

SYSTEMS AND METHODS FOR ADAPTIVELY COMPRESSING TEST DATA

CLAIM OF PRIORITY

This application is a continuation-in-part of co-pending U.S. utility application titled "Systems and Methods for Testing a Device Under Test" having Ser. No. 10/620,191, filed on Jul. 15, 2003, and of U.S. utility application titled "Systems and Methods for Testing Performance of an Electronic Device" having Ser. No. 10/461,252, filed on Jun. 12, 2003 now U.S. Pat. No. 7,100,098, which are entirely incorporated herein by reference.

BACKGROUND

Testing the structure of an electronic device-under-test (DUT), such as, for example, a microprocessor, typically requires providing the device with input and then checking the device's output to determine if there are any defects. The input that is provided to the DUT is typically compressed prior to being provided to a testing device since the testing device has limited memory capacity. However, in some circumstances, there may not be enough computing resources available to adequately compress the data that is to be provided to the testing device. Therefore, there exists a need for systems and methods for addressing these and/or other problems associated with testing a DUT.

SUMMARY

Systems and methods for adaptively compressing test data are disclosed. An embodiment of a method for adaptively compressing test data comprises the steps of: examining a test data file that includes a first plurality of data units corresponding to a first plurality of DUT pins and a second plurality of data units corresponding to a second plurality of DUT pins; compressing the first plurality of data units using a first compression technique; and compressing the second plurality of data units using a second compression technique.

Another embodiment of a method for adaptively compressing test data comprises the steps of examining a test data file that includes test data configured to enable testing the DUT, the test data file including a first plurality of data units and a second plurality of data units, the first plurality of data units corresponding to a first plurality of DUT pins, and the second plurality of data units corresponding to a second plurality of DUT pins; determining that the first plurality of data units have a first compressibility characteristic; and determining that the second plurality of data units have a second compressibility characteristic.

An embodiment of a system for adaptively compressing test data comprises memory configured to store a test data file that includes a first plurality of data units corresponding to a first plurality of DUT pins and a second plurality of data units corresponding to a second plurality of DUT pins, and a processor that is programmed to compress the first plurality of data units using a first compression technique, and to compress the second plurality of data units using a second compression technique.

Another embodiment of a system for adaptively compressing test data includes memory configured to store a test data file that includes test data configured to enable testing the DUT, the test data file including a first plurality of data units and a second plurality of data units, the first plurality of data units corresponding to a first plurality of DUT pins, and the second plurality of data units corresponding to a second plurality of DUT pins; and a processor that is programmed to determine that the first plurality of data units have a first compressibility characteristic, and that the second plurality of data units have a second compressibility characteristic.

Other systems, methods, features and/or advantages will be or may become apparent to one with skill in the art upon examination of the following figures and detailed description. It is intended that all such additional systems, methods, features, and/or advantages be included within this description and be protected by the accompanying claims.

BRIEF DESCRIPTION OF THE DRAWINGS

In the drawings, like reference numerals designate corresponding parts throughout the several views. Furthermore, the components in the drawings are not drawn to scale.

DETAILED DESCRIPTION

Disclosed are systems and methods for adaptive compression of test data for testing an electronic device-under-test (DUT). As will be described in more detail, test data within a test data file may be separated based on one or more properties of the test data. For example, a first set of data corresponding to a first set of DUT pins is separated from a second set of data corresponding to a second set of DUT pins. In this manner, the first and second sets of data may be compressed using different compression techniques and may be provided to respective testing resources operating in different timing domains. The testing resources may then use the respective sets of data to test the structure, functionality and/or performance of the DUT via respective sets of DUT pins.

Figure 1A:
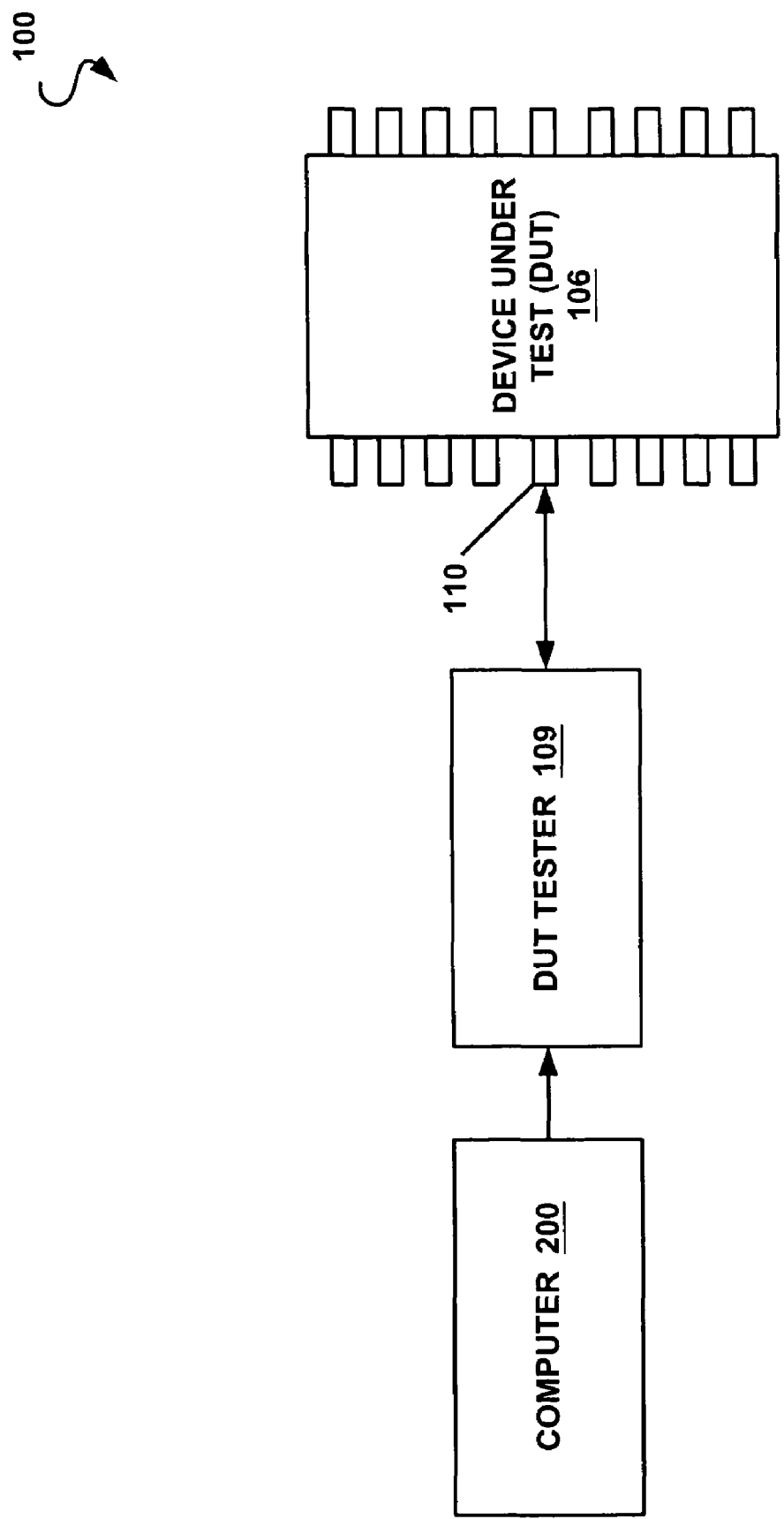
FIG. 1A is a block diagram depicting an embodiment of a testing system.

FIG. 1A is a block diagram depicting an embodiment of a testing system 100. The testing system 100 includes a DUT tester 109 coupled to at least one DUT pin 110. The DUT tester 109 is used to detect errors in the operation of the DUT 106 by providing input to and/or receiving output from the DUT pin 110. The DUT 106 may be, for example, a processor or other digital device that receives and outputs digital signals. A computer 200 may be used to configure and/or to provide test data to the DUT tester 109. The computer 200 may be a specific or general purpose computer including, for example, a desk-top computer, a lap-top computer, or a mainframe computer, among others. In an alternative embodiment, the functionality of computer 200 may be incorporated into the DUT tester 109.

Figure 1B:
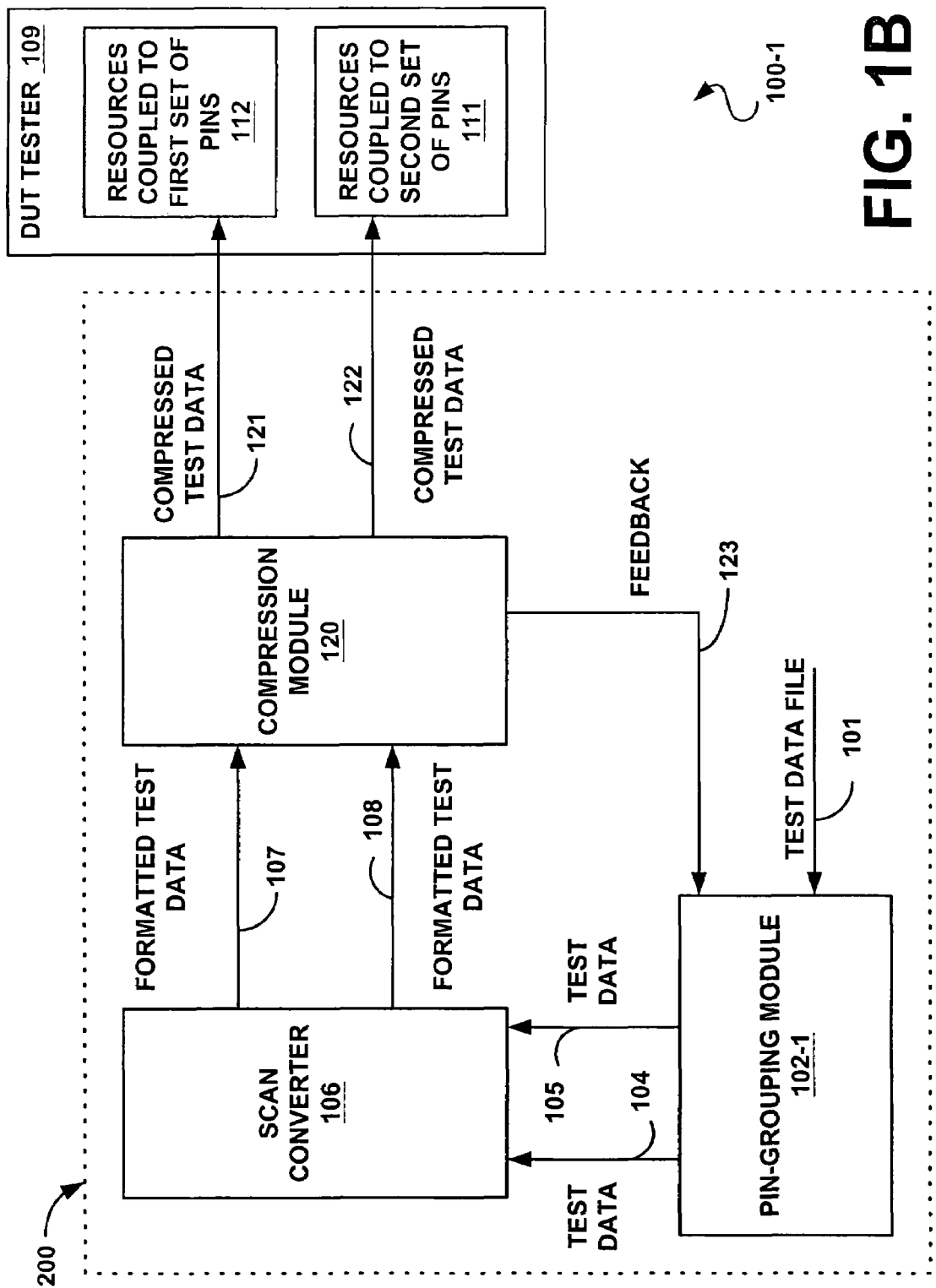
FIG. 1B is a block diagram depicting the embodiment of the testing system of FIG. 1A.

FIG. 1B is a block diagram depicting an embodiment of a testing system 100-1. The testing system 100-1 includes a pin-grouping module 102-1 for separating test data corresponding to a first set of DUT pins from test data corresponding to a second set of DUT pins. The pin-grouping module 102-1 receives a test data file 101 that includes test data corresponding to the first set of DUT pins and test data corresponding to the second set of DUT pins. The format of the test data file 101 may be, for example, STIL (standard test interface language) or WGL (waveform generation language), among others. From the test data file 101, the pin-grouping module 102-1 separates test data 104 corresponding to the first set of DUT pins from test data 105 corresponding to the second set of DUT pins, and provides the test data 104 to a scan converter 106 separately from the test data 105. For example, the test data 104 may be provided to the scan converter 106 before and/or after the test data 105.

The scan converter 106 formats the test data 104 independently from the test data 105 to produce formatted test data 107 and 108, respectively, that are subsequently provided to a compression module 120. The formatted test data 108 has different properties than the formatted test data 107, including, for example, different timing complexity, vector data volume, and repetitiveness, among others. The compression module 120 compresses the formatted test data 107 and 108 to produce compressed test data 121 corresponding to a first set of DUT pins and compressed test data 122 corresponding to a second set of DUT pins, respectively. The compressed test data 121 and the compressed test data 122 are then provided to a DUT tester 109.

The compression module 120 also provides feedback 123 to the pin-grouping module 102-1 regarding the compressibility characteristics of data 107 and 108 received by the compression module 120. This feedback 123 enables the pin-grouping module to better separate test data 104 and 105 based on their compressibility characteristics.

The DUT tester 109 includes resources 112 coupled to the first set of pins of a DUT, and resources 111 coupled to a second set of pins of the DUT. The resources 112 may operate in a different timing domain than the resources 111. For example, the resources 112 may include processors running at a first clock speed, and the resources 111 may include processors running at a second clock speed. The resources 112 receive the compressed test data 121 and provide or receive corresponding test signals to/from the first set of DUT pins. On the other hand, the resources 111 receive the compressed test data 122 and provide or receive corresponding test signals to/from the second set of DUT pins.

Figure 1C:
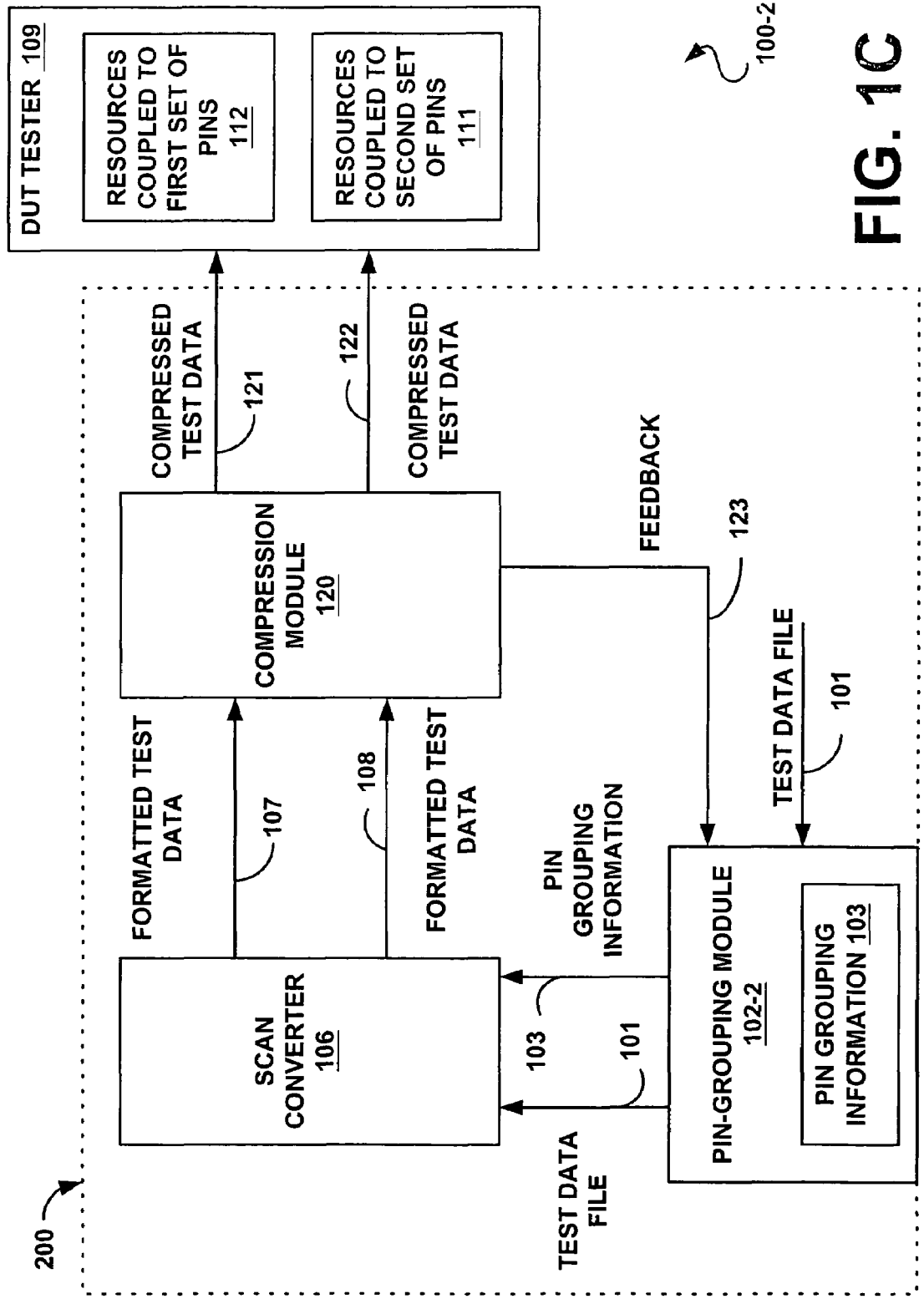
FIG. 1C is a block diagram depicting another embodiment of the testing system of FIG. 1A.

FIG. 1C is a block diagram depicting an embodiment of a testing system 100-2. The pin-grouping module 102-2 receives a test data file 101 and uses the test data file 101 to create pin-grouping information 103 identifying a first set of DUT pins and/or a second set of DUT pins. The pin-grouping module 102-2 then provides the pin-grouping information 103 and the test data file 101 to the scan converter 106. The scan converter 106 uses the pin-grouping information 103 to format test data (within the test data file 101) corresponding to the first set of DUT pins separately from test data corresponding to the second set of DUT pins. The scan converter 106 then provides formatted test data 107 (corresponding to the first set of DUT pins) and formatted test data 108 (corresponding to the second set of DUT pins) to the compression module 120. The DUT tester 109 and the compression module 120 shown in FIG. 1B may, for example, be configured to operate as described in reference to FIG. 1A. The pin-grouping module 102-2 may use feedback 123 from the compression module 120 to formulate pin grouping information 103. This feedback 123 enables the pin-grouping module to better group DUT pins based on the compressibility characteristics of their respective test data.

Figure 2:
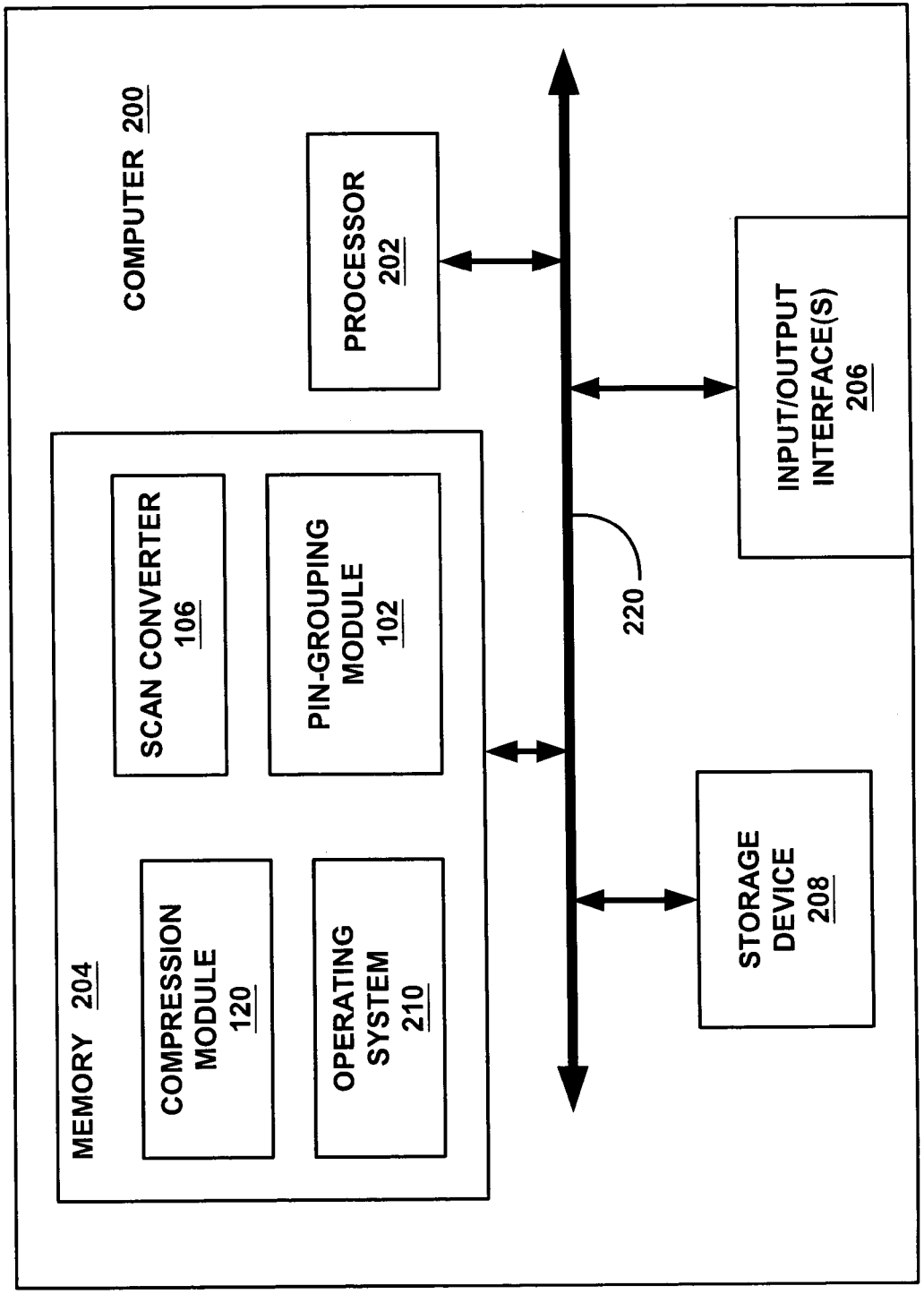
FIG. 2 is a block diagram depicting an embodiment of the computer shown in FIG. 1A.

FIG. 2 is a block diagram depicting an embodiment of a computer 200 for executing the pin-grouping module 102, the scan converter 106, and the compression module 120 depicted in FIGS. 1A and 1B. Generally, in terms of hardware architecture, as shown in FIG. 2, the components of the computer 200 include a processor 202, memory 204, input/output (I/O) interfaces 206, and a storage device 208. These components (202, 204, 206, and 208) may be communicatively coupled via a local interface 220, which may comprise, for example, one or more buses or other wired or wireless connections.

The processor 202 is a hardware device for executing software, particularly that stored in memory 204. When the computer 200 is in operation, the processor 202 is configured to execute software stored within the memory 204, to communicate data to and from the memory 204, and to generally control operations of the computer 200 pursuant to the software.

The I/O interfaces 206 may be used to communicate with one or more peripheral devices including, for example, a printer, a copier, a keyboard, a mouse, and/or a monitor, etc. The I/O interfaces 206 may include, for example, a serial port, a parallel port, an IR interface, an RF interface, and/or a universal serial bus (USB) interface.

The memory 204 can include any one or combination of volatile and/or non-volatile memory elements now known or later developed. For example, the memory 204 may comprise random access memory (RAM), read only memory (ROM), a hard disk, a tape, and/or a compact disk ROM (CD-ROM), among others. Note that the memory 204 can have a distributed architecture, where various components are situated remote from one another, but can be accessed by the processor 202.

The software applications in memory 204 include an operating system (OS) 210, a compression module 120, a scan converter 106, and a pin-grouping module 102. The OS 210 essentially controls the execution of the other applications, and provides scheduling, input-output control, file and data management, memory management, and/or communication control, among other functionality. The pin-grouping module 102 may be used to identify test data corresponding to the first set of DUT pins and/or to separate test-data for clock pins from test-data for the second set of DUT pins. The scan converter 106 may be used to format the test data, whereas the compression module 120 may be used to compress the test data using multiple compression techniques, as will be discussed in more detail below. The scan converter 106, the compression module 120, and pin-grouping module 102 may each be a source program, an executable program (e.g., object code), a script, or any other entity comprising a set of instructions to be executed.

Furthermore, the scan converter 106, the compression module 120, and pin-grouping module 102 may each be embodied in any computer-readable medium for use by or in connection with an instruction execution system, apparatus, or device, such as a computer-based system or a processor-containing system. In the context of this disclosure, a "computer-readable medium" can be any means that can store, communicate, propagate, or transport a program for use by or in connection with the instruction execution system, apparatus, or device. The computer-readable medium can be, for example, among others, an electronic, magnetic, optical, electromagnetic, infrared, or semiconductor system, apparatus, device, or propagation medium now known or later developed.

Figure 3:
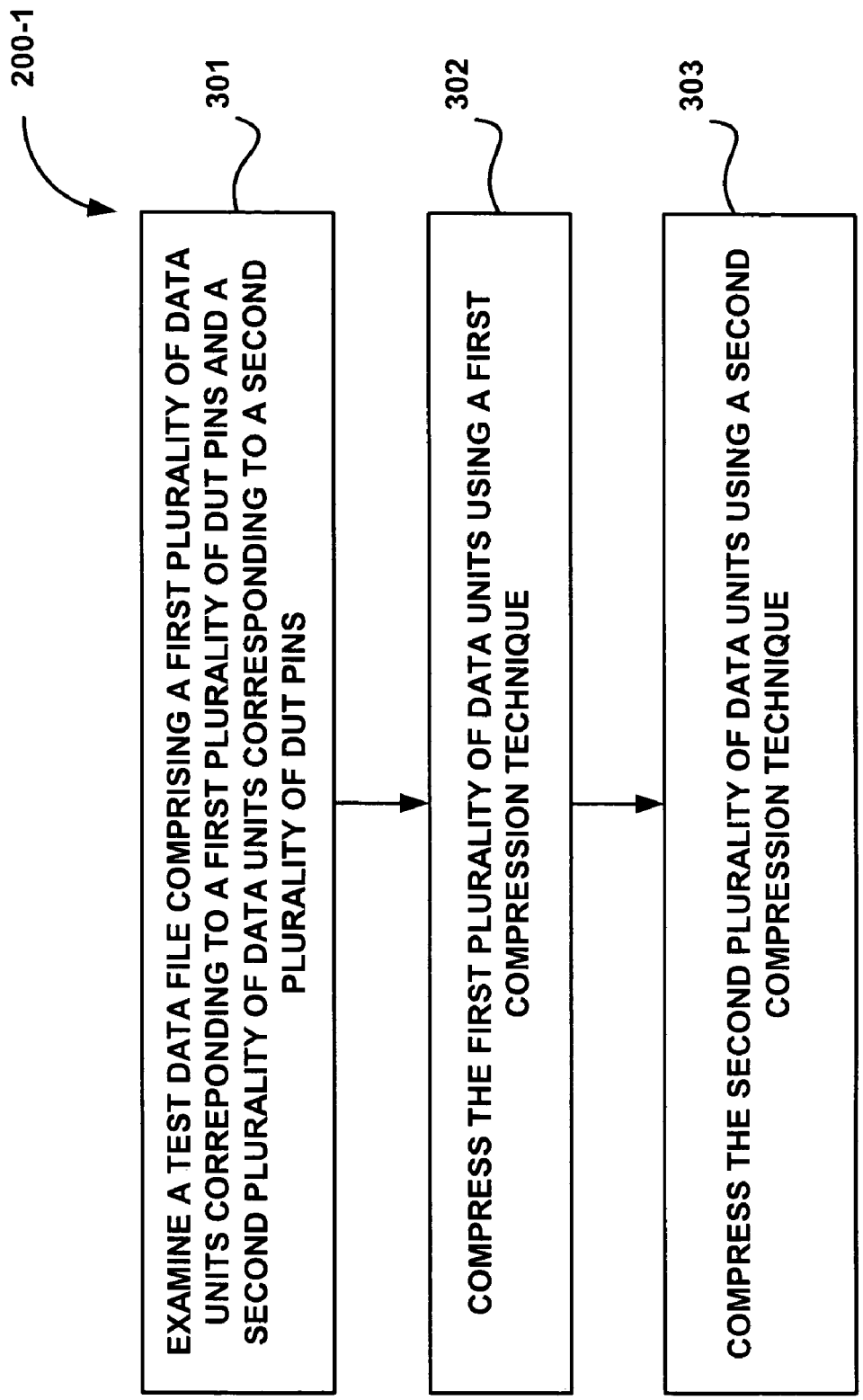
FIG. 3 is a flow chart depicting an embodiment of a method that may be implemented by the computer shown in FIG. 1A.

FIG. 3 is a flow chart depicting an embodiment of a testing method 200-1. As indicated in step 301, a test data file 101 is examined. The format of the test data file 101 may be, for example, STIL or WGL. The test data file 101 includes a first plurality of data units corresponding to a first plurality of DUT pins and a second plurality of data units corresponding to a second plurality of DUT pins. The first plurality of data units are then compressed using a first compression technique, and the second plurality of data units are compressed using a second compression technique, as indicated blocks 302 and 303, respectively. The first compression technique may be, for example, run-length encoding, and the second compression technique may involve, for example, generating waveforms described by a waveform table 708, as described further below. Any feasible compression techniques now known or later developed may alternatively be used.

Figure 4A:
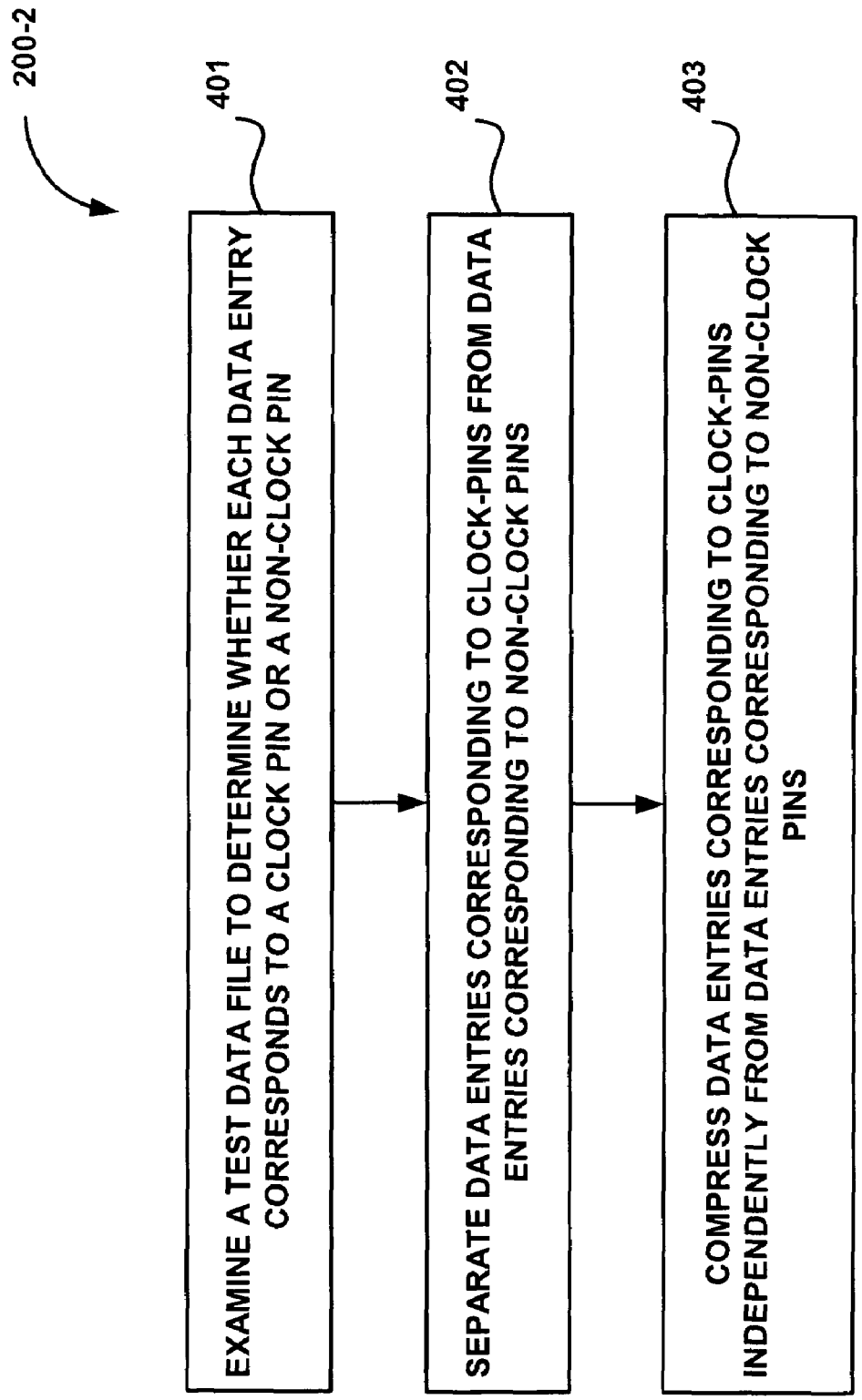
FIG. 4 is a flow chart depicting another embodiment of a method that may be implemented by the computer shown in FIG. 1A.

FIG. 4A is a flow chart depicting an embodiment of a testing method 200-2. As indicated in step 401, a test data file 101 (FIG. 1A) is examined to determine whether each data entry in the test data file 101 corresponds to a clock-pin or to a non-clock-pin. For example, in a STIL file, a data entry corresponding to a clock-pin may include a label identifying the data entry as such. These labels may be used to determine the type of pin to which each respective data entry corresponds. Data units corresponding to clock-pins are then separated and formatted and compressed independently from data units corresponding to non-clock-pins, as indicated in steps 402 and 403, respectively. As a result of this adaptive compression of data units based on the type of their corresponding DUT pins (clock pins vs. non-clock pins), the data units may be more effectively and efficiently compressed.

Figure 4B:
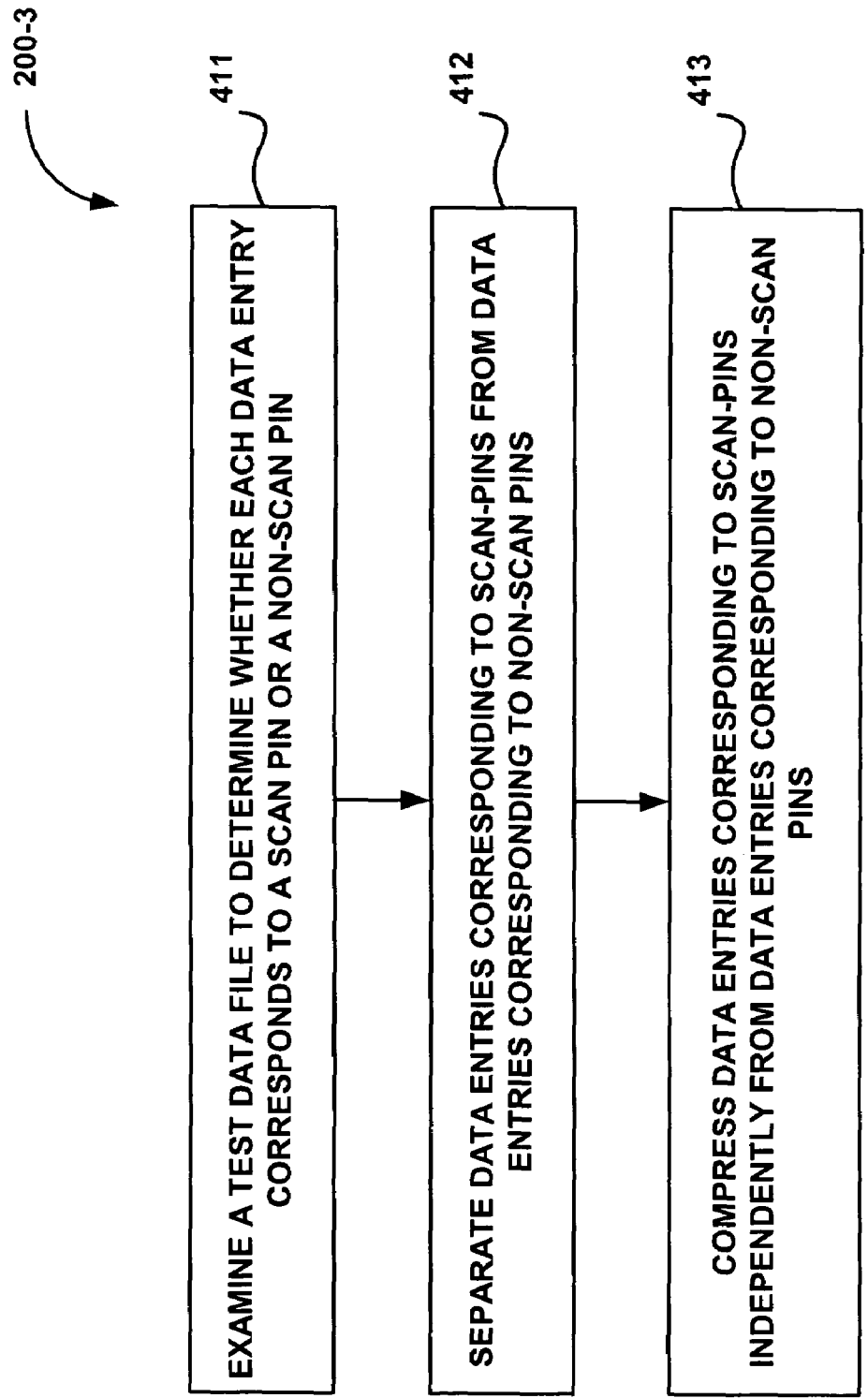

FIG. 4B is a flow chart depicting an embodiment of a testing method 200-3. As indicated in step 411, a test data file 101 (FIG. 1A) is examined to determine whether each data entry in the test data file 101 corresponds to a scan-pin or to a non-scan-pin. For example, in a STIL file, a data entry corresponding to a scan-pin may include a label identifying the data entry as such. These labels may be used to determine the type of pin to which each respective data entry corresponds. Data units corresponding to scan-pins are then separated and formatted and compressed independently from data units corresponding to non-scan-pins, as indicated in steps 412 and 413, respectively. As a result of this adaptive compression of data units based on the type of their corresponding DUT pins (scan pins vs. non-scan pins), the data units may be more effectively and efficiently compressed.

Figure 5:
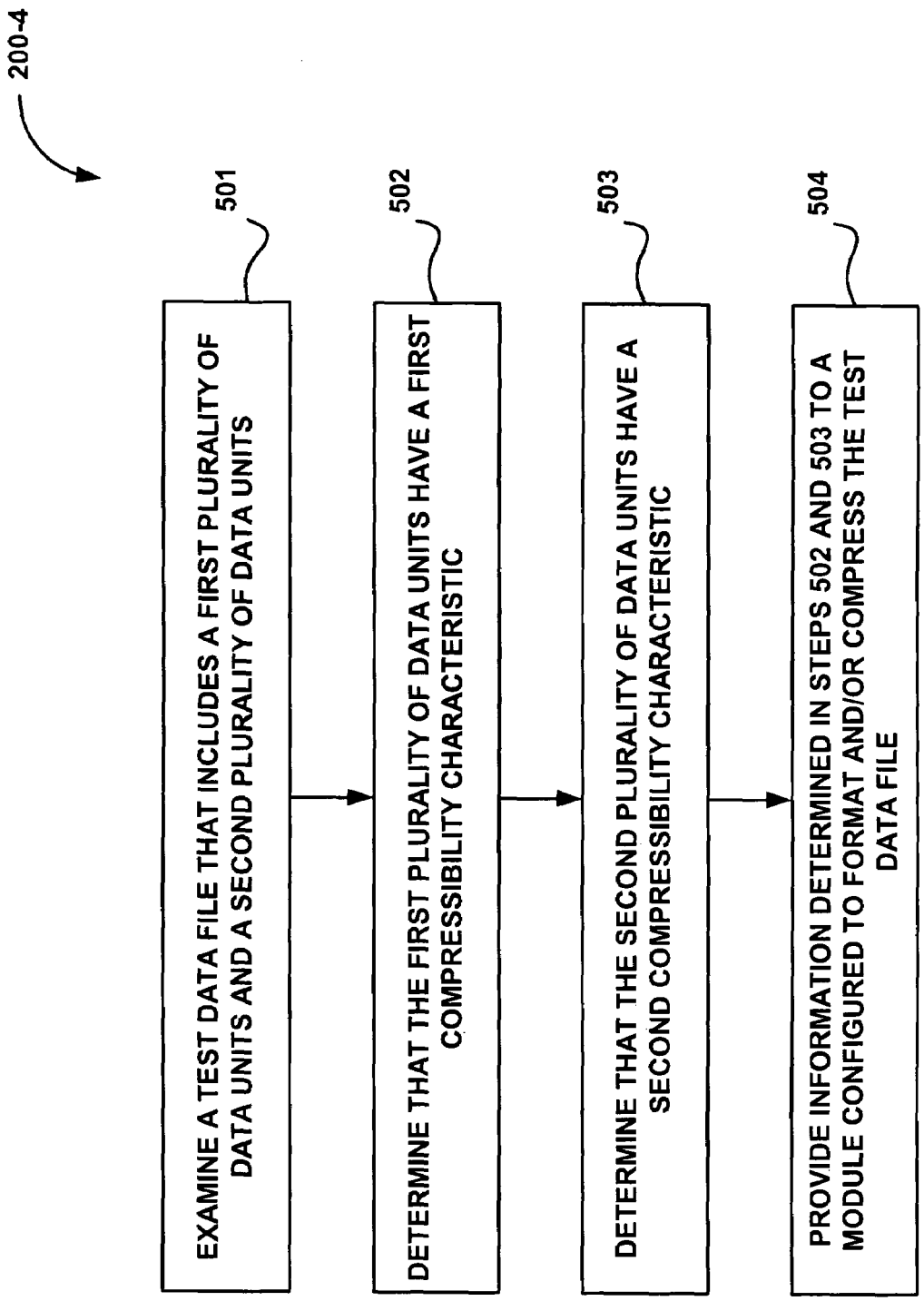
FIG. 5 is a flow chart depicting yet another embodiment of a method that may be implemented by the computer shown in FIG. 1A.

FIG. 5 is a flow chart depicting an embodiment of a testing method 200-4. As indicated in step 501, a test data file is examined. The test data file includes a first plurality of data units and a second plurality of data units. The first plurality of data units are then determined to have a first compressibility characteristic, and the second plurality of data units are determined to have a second compressibility characteristic, as indicated in steps 502 and 503, respectively. The information determined in steps 502 and 503 is then provided to one or more modules configured to format and/or compress the test data file, as indicated in step 504. This information enables the first plurality of data units to be compressed using a different method and/or format than the second plurality of data units.

Figure 6A:
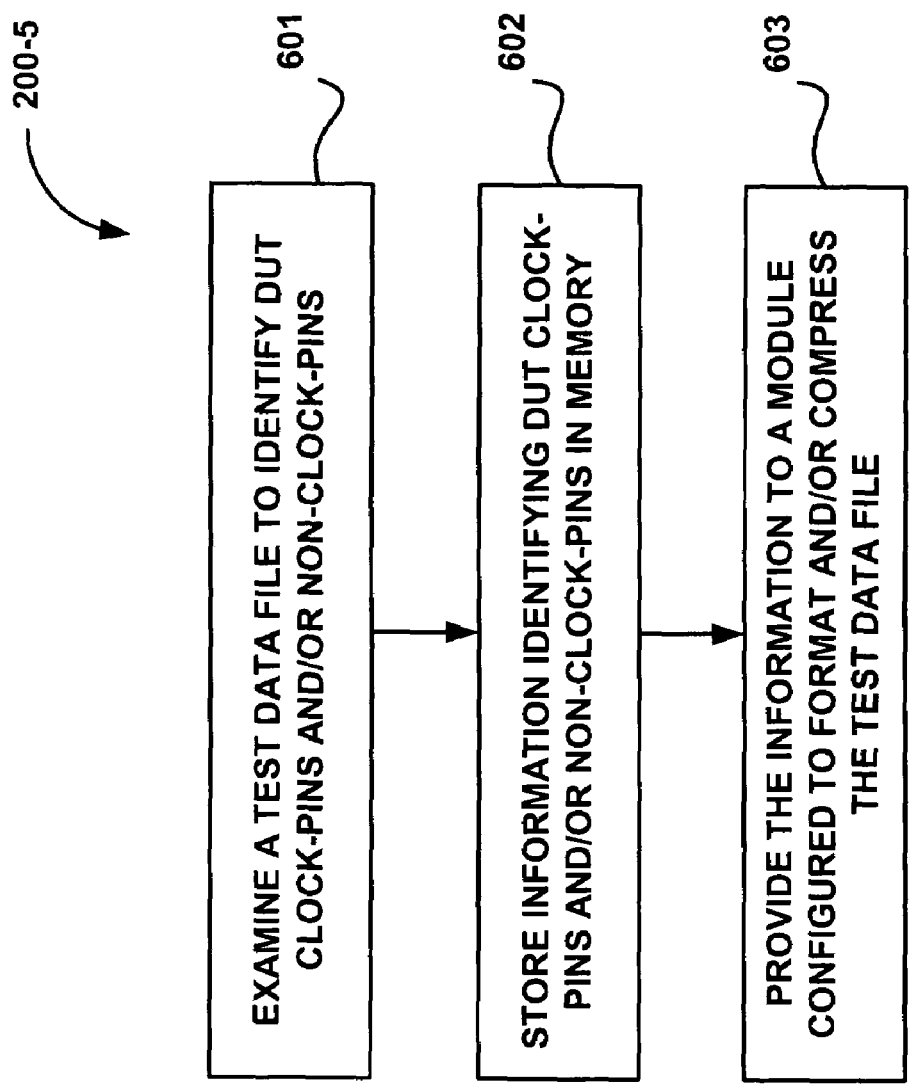
FIG. 6 is a flow chart depicting a further embodiment of a method that may be implemented by the computer shown in FIG. 1A.

FIG. 6A is a flow chart depicting an embodiment of a testing method 200-5. As indicated in step 601, a test data file 101 (FIG. 1B) is examined to identify DUT clock-pins and/or non-clock-pins that are to receive the test data. Information identifying the clock-pins and/or non-clock-pins is then stored in memory, and is provided (in addition to the test data file 101) to a module configured to format the test data file 101, as indicated in steps 602 and 603, respectively. This information enables data corresponding to clock-pins to be compressed using a different method and/or format than data corresponding to non-clock-pins.

Figure 6B:
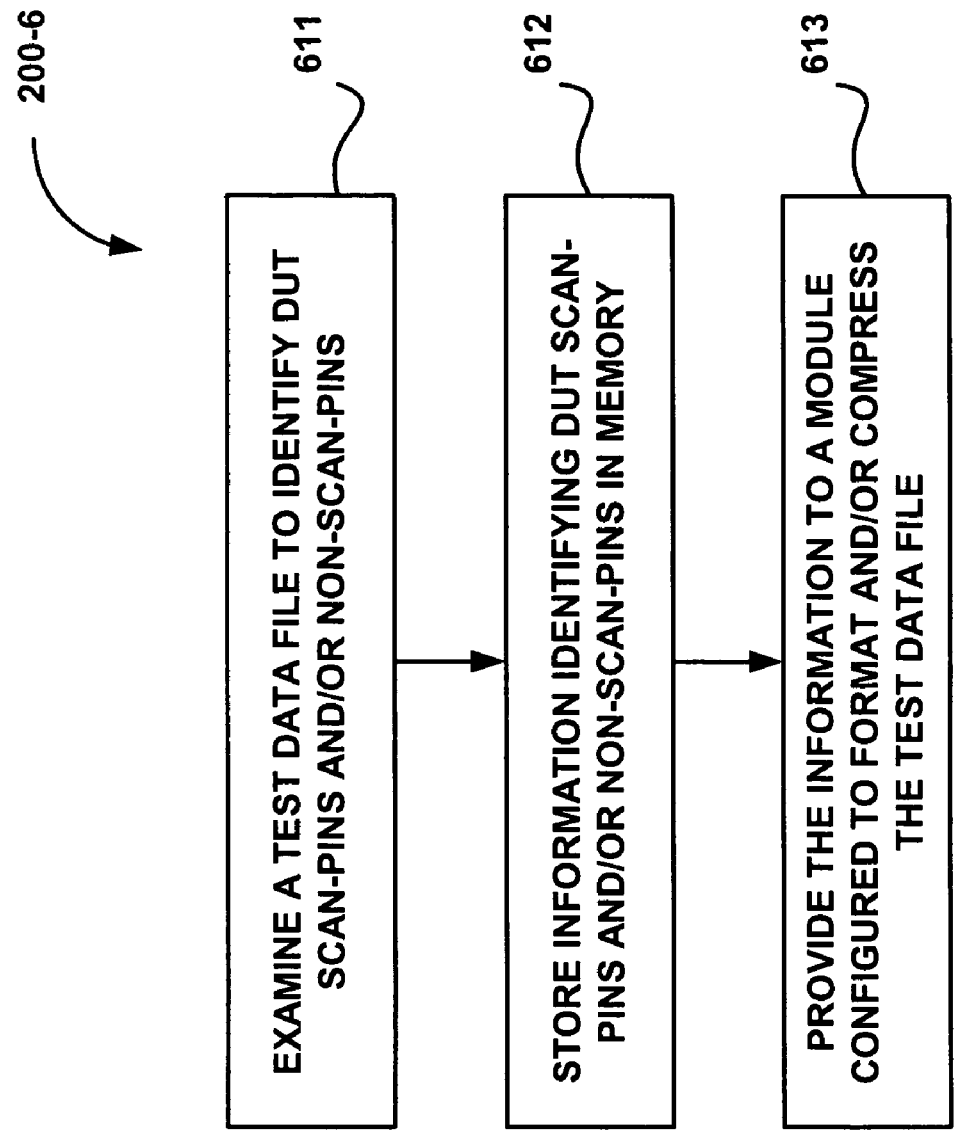

FIG. 6B is a flow chart depicting an embodiment of a testing method 200-6. As indicated in step 611, a test data file 101 (FIG. 1B) is examined to identify DUT scan-pins and/or non-scan-pins that are to receive the test data. Information identifying the scan-pins and/or non-scan-pins is then stored in memory, and is provided (in addition to the test data file 101) to a module configured to format the test data file 101, as indicated in steps 612 and 613, respectively. This information enables data corresponding to scan-pins to be compressed using a different method and/or format than data corresponding to non-scan-pins.

Figure 7:
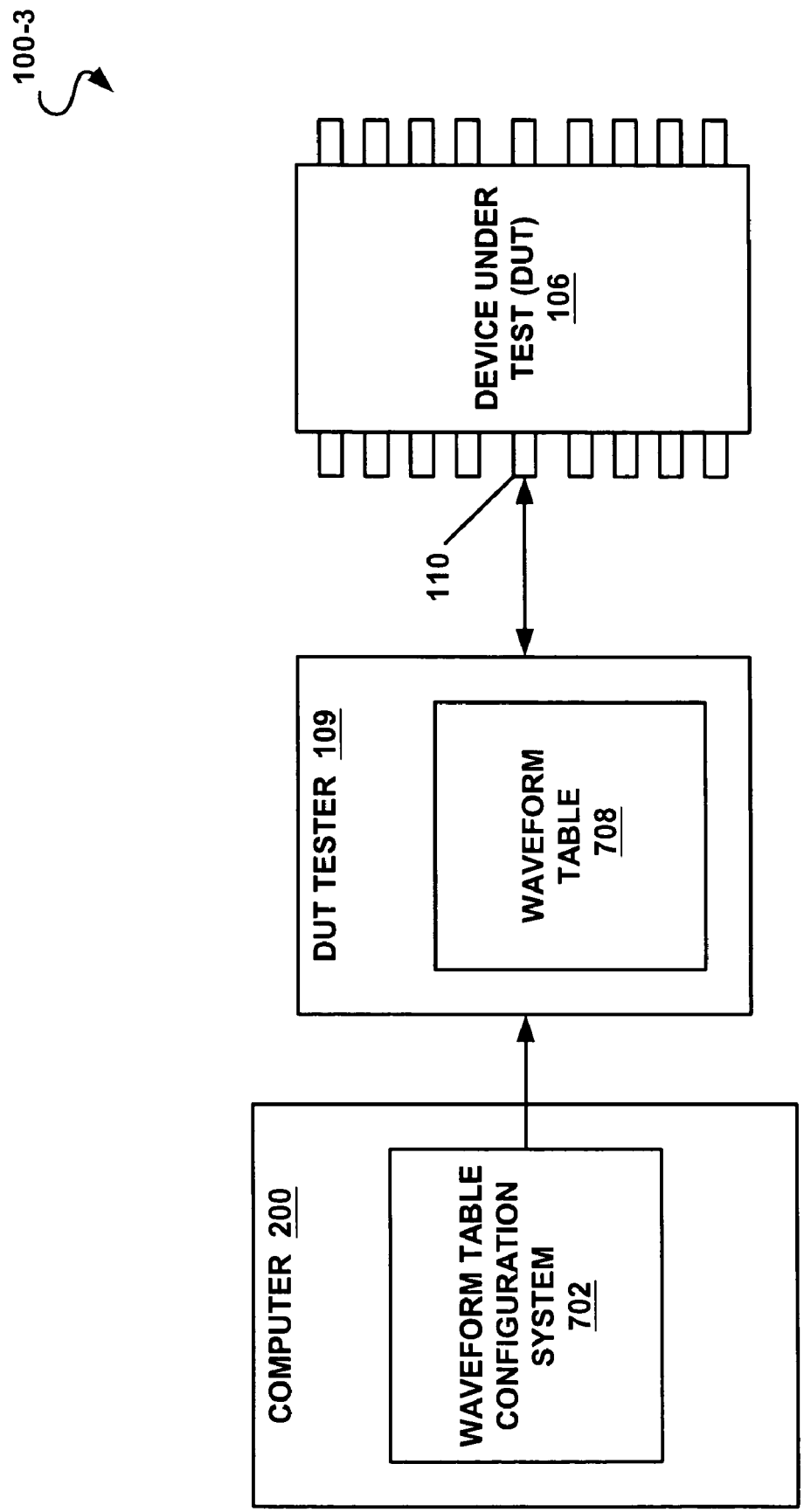
FIG. 7 is a block diagram depicting another embodiment of a testing system.

FIG. 7 is a block diagram depicting an embodiment of a testing system 100-3 that uses a waveform table 708 to achieve compression of test data. The testing system 100-3 includes a DUT tester 109 coupled to a DUT pin 110. The DUT tester 109 is used to detect errors in the operation of the DUT 106 by providing input to and/or receiving output from the DUT pin 110. The DUT tester 109 includes a waveform table 708 that is used in providing test data to the DUT 106. The waveform table 708 includes waveform entries that define respective waveforms. The computer 200 includes a waveform configuration system 702 that is used to configure the waveform table 708. In alternative embodiments, the functionality of the waveform configuration system 702 may be incorporated into the DUT tester 109.

Figure 8:
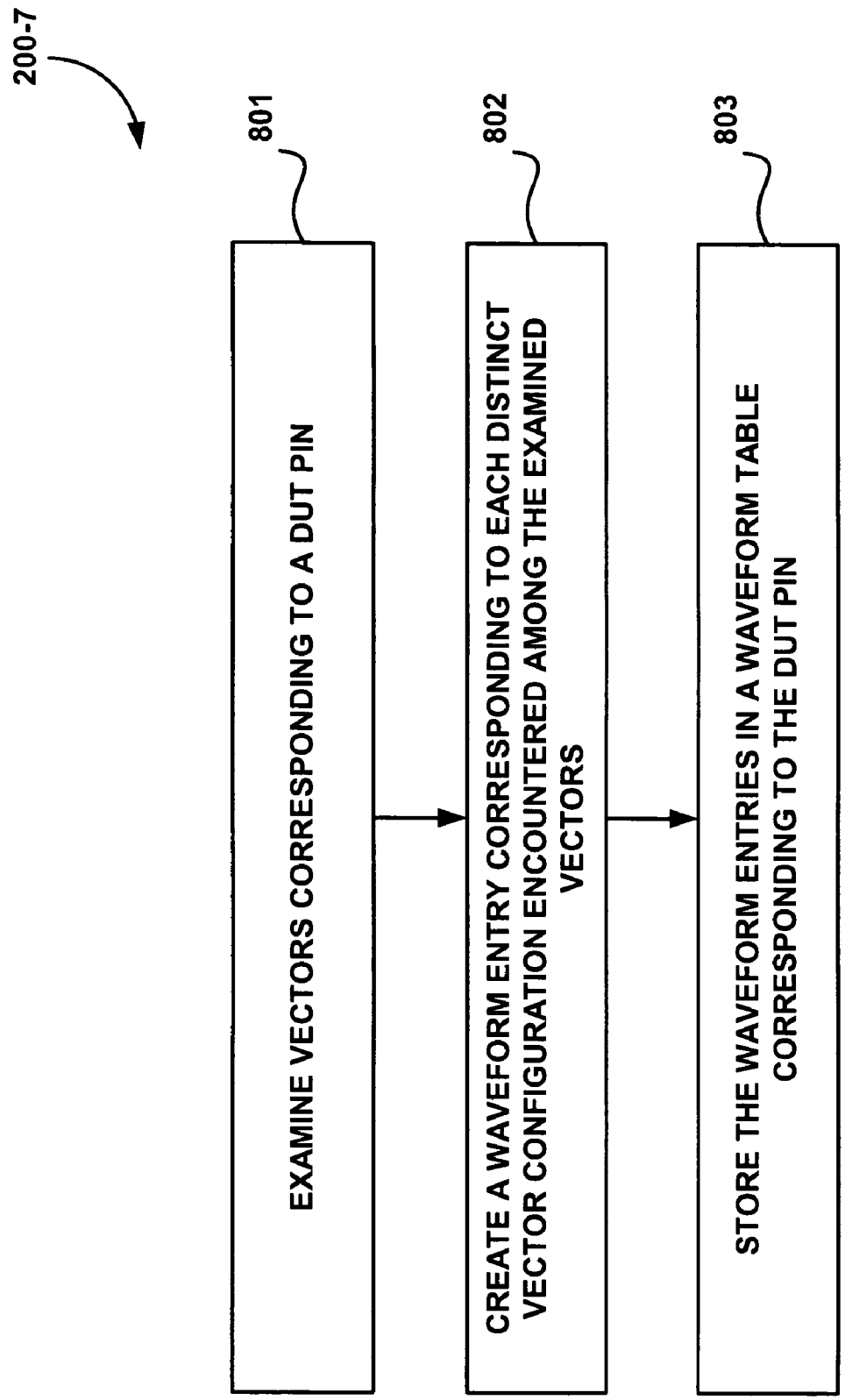
FIG. 8 is a flow chart depicting an embodiment of a method for configuring the waveform table shown in FIG. 7.

FIG. 8 is a flow chart depicting an embodiment of a method 200-7 for configuring a waveform table 708 (FIG. 7). Vectors corresponding to a DUT pin 110 are examined, as indicated in block 801. A waveform entry representing each distinct vector configuration (encountered among the examined vectors) is created, as indicated in block 802. The waveform entries are stored in a waveform table corresponding to the DUT pin 110, as indicated in block 803. The waveform table may then be used to provide input to the DUT pin 110 and/or to provide data that is compared to the output of the DUT pin 110, as described, for example, in reference to FIGS. 9 and 11.

As a non-limiting example, assume that the following string of characters corresponds to input that is to be provided to a DUT pin 110:

TABLE 1

String Of Characters

1110100000000001111000011011010100000000000000000000000000000001

The string of characters in Table 1 may be converted to the following three-character vectors:

TABLE 8

Three-Character Vectors 111, 010, 000, 000, 000, 111, 100, 001, 101, 101, 010, 000, 000, 000, 000, 000, 000, 000, 000, 000, 01X A waveform entry may then be created for each distinct vector configuration encountered among the vectors in Table 8. The distinct vector configurations are as follows:

TABLE 9

Distinct Vector Configurations 111, 101, 100, 000, 001, 010, 01X

In the above example, waveform entries would not be created for the possible vectors 110 and 011, since such vectors were not encountered among the examined vectors. In cases where the input to a DUT pin 110 is more complex, the method 200-7 may be used to create a limited number of waveform entries representing a very small fraction of the number of possible waveform entries.

If the number of waveform entries corresponding to a waveform table 708 exceeds a predetermined limit, or if the waveforms entries would otherwise overwhelm resources of the DUT tester 109, then waveform entries corresponding to the least encountered type of vectors may be eliminated accordingly (e.g., until the number of waveform entries is equal to the predetermined limit). Alternatively, or additionally, the size of the waveform entries may be reduced to correspond to smaller vectors (i.e., vectors having fewer state characters). For example, if using three-character vectors results in a number of waveform entries that exceeds the pre-determined limit, then two-character vectors may be used instead.

Figure 9:
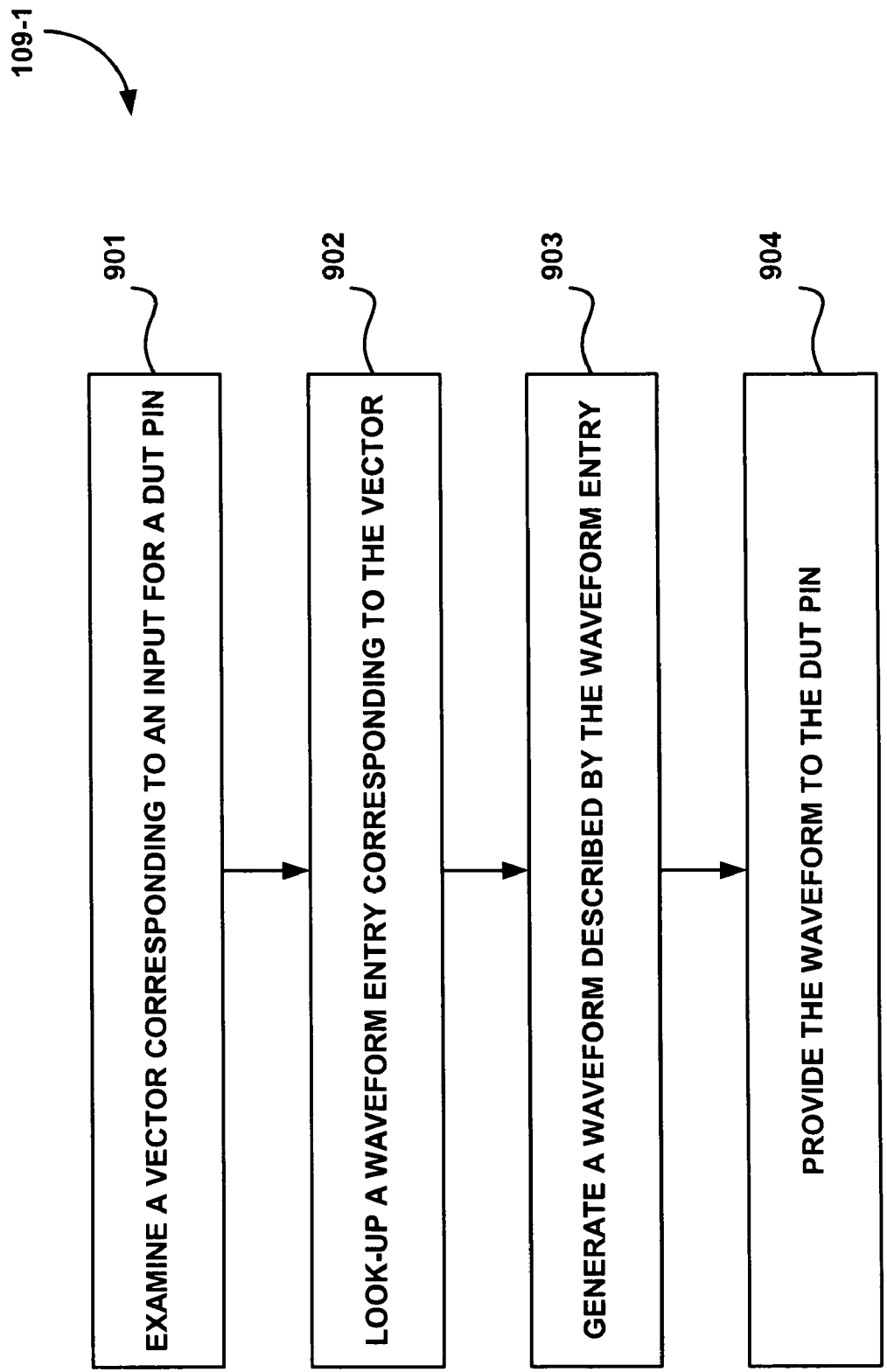
FIG. 9 is a flow chart depicting an embodiment of a method for using the waveform table shown in FIG. 7.

FIG. 9 is a flow chart depicting an embodiment of a method 109-1 for using a waveform table 708 (FIG. 7) to achieve data compression. The method 109-1 may be suitable for achieving compression of data corresponding to non-clock pins. Other methods may be used for achieving compression of data corresponding to clock pins, including, for example, run-length encoding. As indicated in block 901, a vector corresponding to an input for a DUT pin 110 is examined. A waveform entry corresponding to the vector is then looked-up, as indicated in block 902, and a waveform identified by the waveform entry is generated, as indicated in block 903. The generated waveform is then provided to the DUT pin 110, as indicated in block 904.

Figure 10:
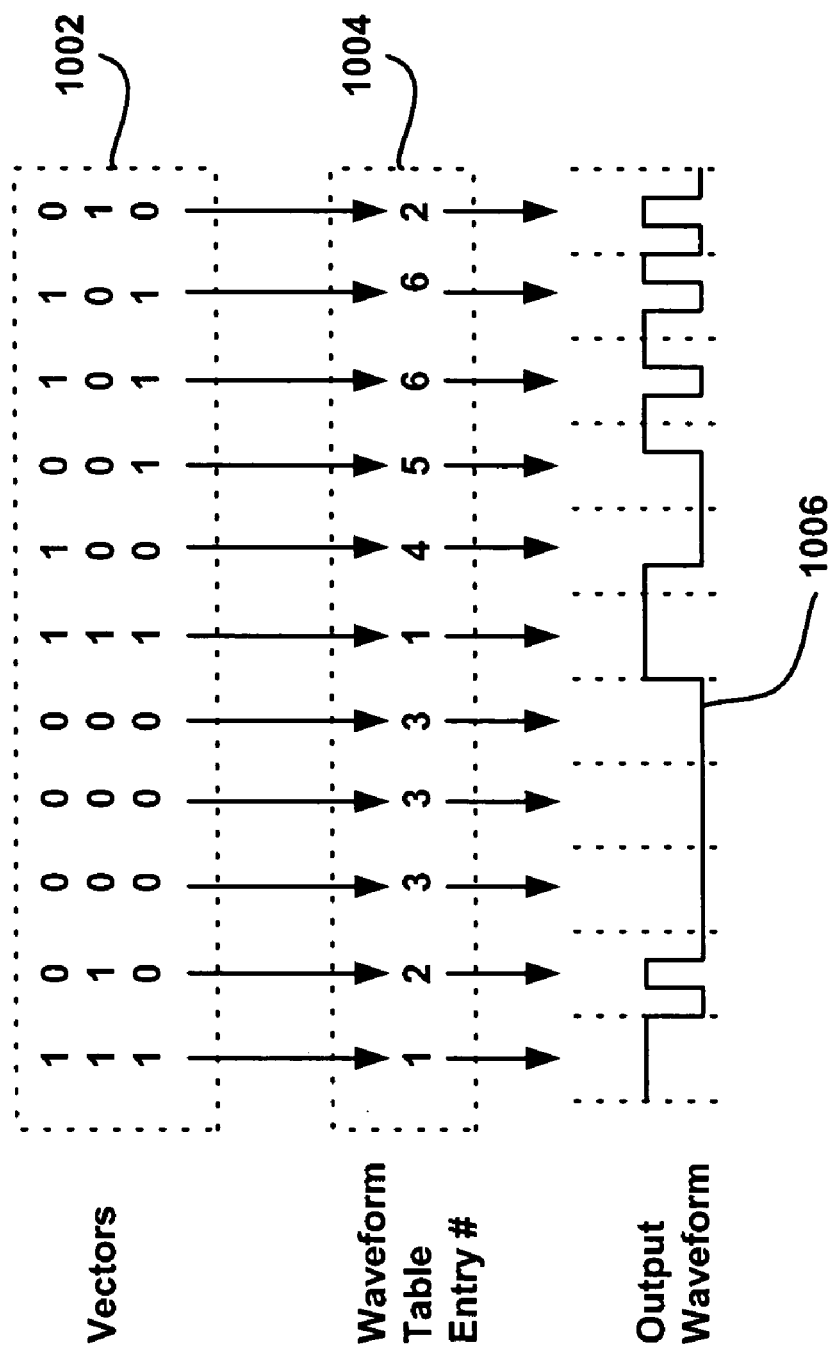
FIG. 10 provides an example of a waveform that is constructed by the DUT tester shown in FIG. 7.

FIG. 10 is an example of a waveform 1006 that is constructed responsive to input vectors 1002. Each of the input vectors 1002 is mapped to a waveform entry 1004 in a waveform table 708 (FIG. 7). Then each waveform entry 1004 is used to generate a corresponding portion of a waveform 1006. Each portion of the waveform 1006 (other than an initial portion) is output at a predetermined time after an immediately preceding portion of the waveform 1006 to ensure continuity of the waveform 1006. The waveform 1006 may then be provided to the DUT 106 (FIG. 1) or may be compared with a waveform received from the DUT 106, depending on whether the input vectors 1002 correspond to DUT input or DUT output.

Figure 11:
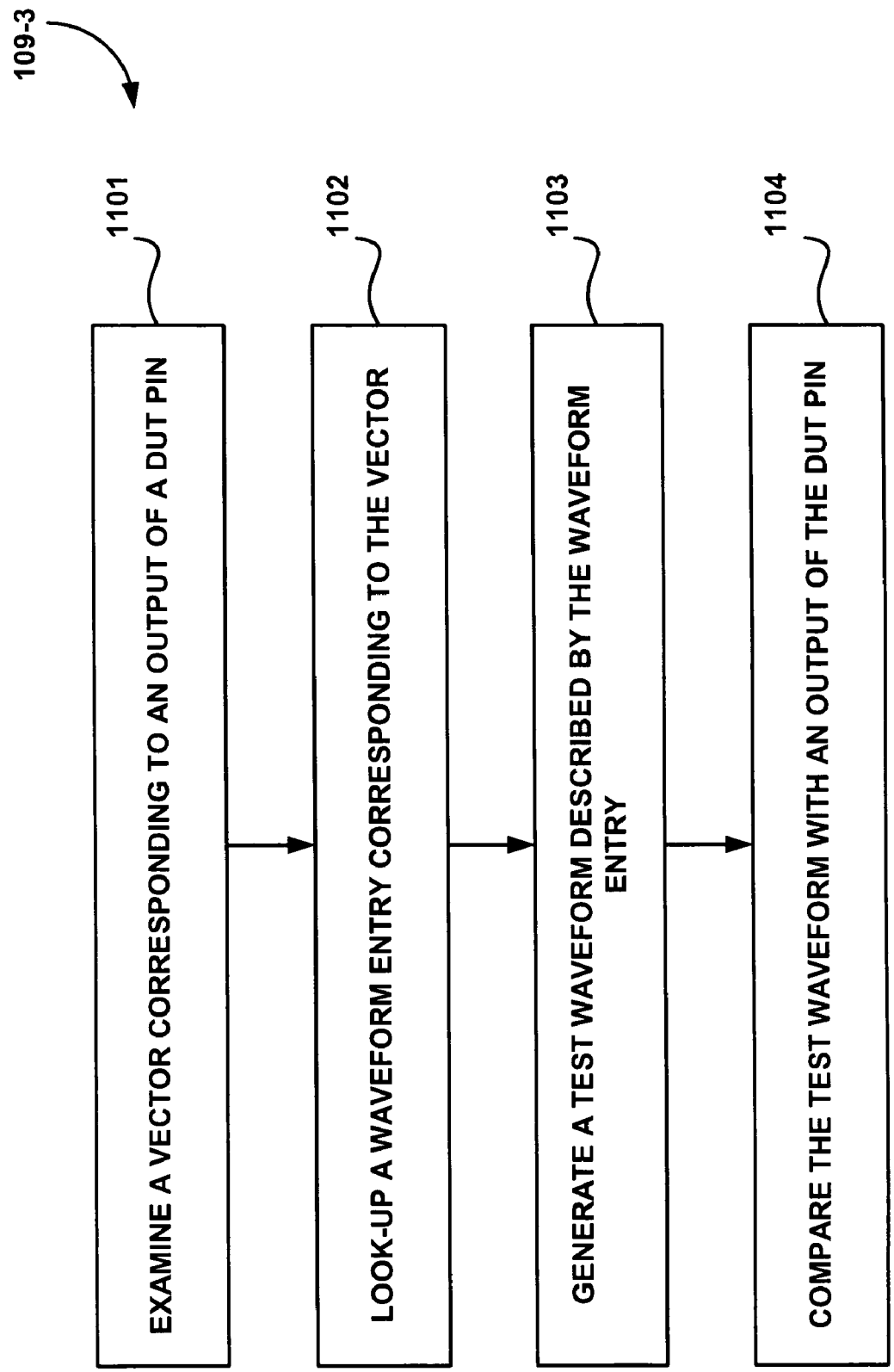
FIG. 11 is a flow chart depicting an embodiment of another method for using the waveform table shown in FIG. 7.

FIG. 11 is a flow chart depicting an embodiment of another method 109-3 for using a waveform table 708 (FIG. 7). As indicated in block 1101, a vector corresponding to an input for a DUT pin 110 is examined. A waveform entry corresponding to the vector is then looked up using the waveform table 708 (FIG. 7), as indicated in block 1102, and a test waveform identified by the waveform entry is generated, as indicated in block 1103. The test waveform is then compared with an output of the DUT pin 110, as indicated in block 1104. By comparing the test waveform with an output of the DUT pin 110, possible errors in the performance of the DUT 106 (FIG. 1) may be detected.

Figure 12:
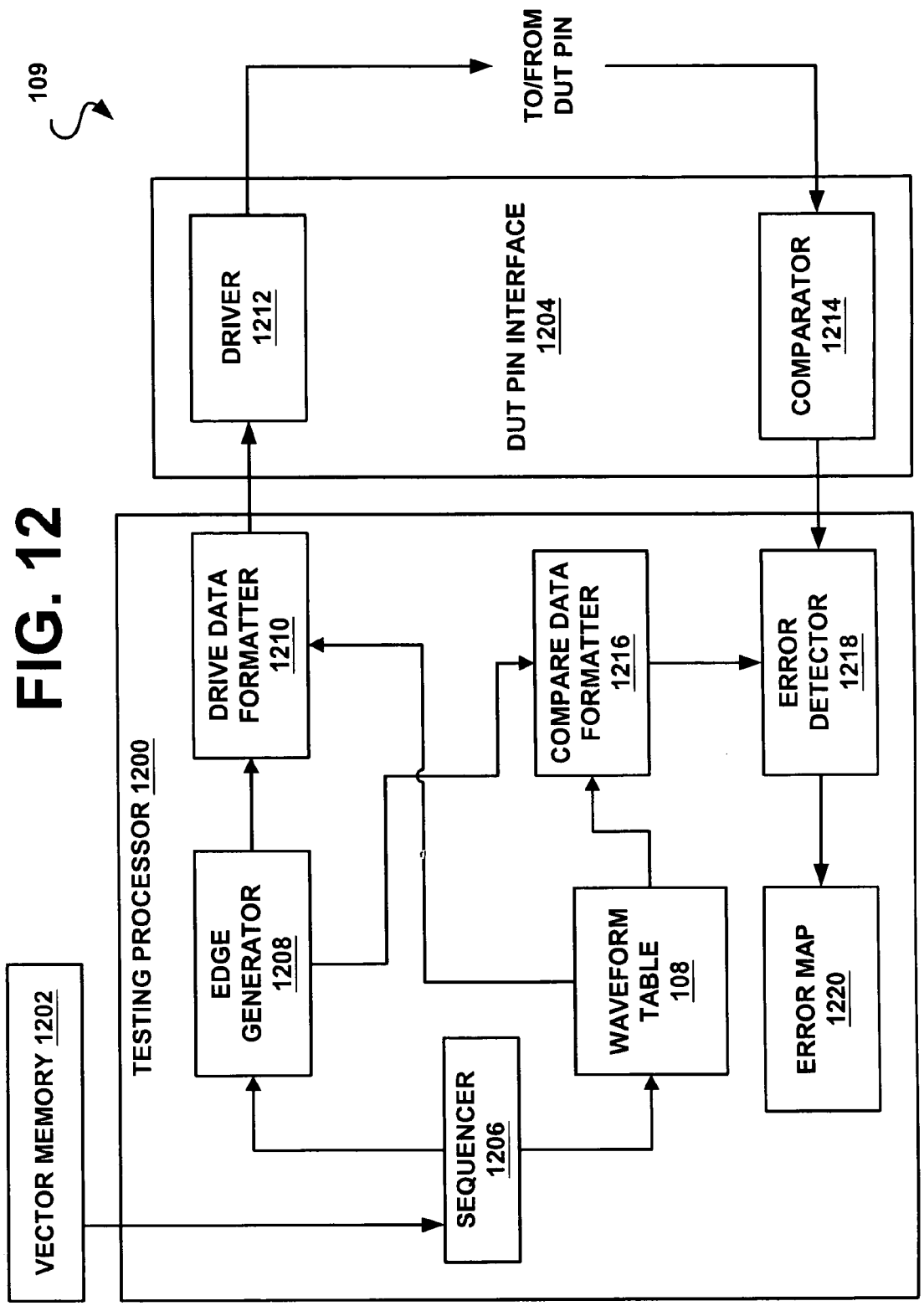
FIG. 12 is a block diagram depicting an embodiment of a DUT tester.

FIG. 12 is a block diagram depicting an embodiment of an DUT tester 109. The DUT tester 109 includes a testing processor 1200, a vector memory 1202, and a DUT pin interface 1204. The vector memory 1202 stores test data that is to be used for testing the DUT 106 (FIG. 1). The DUT pin interface 1204 provides input test signals to and/or receives output test signals from a certain DUT pin 110. The testing processor 1200 converts test data received from the vector memory 1202 into input and/or output waveforms.

The sequencer 1206 sequentially retrieves vectors (e.g., character sequences) from the vector memory 1202, causes the waveform table 708 to output respective waveform data, and causes the edge generator 1208 to output respective timing information.

If a vector retrieved from the vector memory 1202 represents data that is to be provided to the DUT pin 110, then the drive data formatter 1210 formats a waveform using the waveform data and timing information (provided by the waveform table 708 and the edge generator 1208, respectively). The drive data formatter 1210 then provides the formatted waveform to the driver 1212 which outputs the formatted waveform to the DUT pin 110.

If a vector retrieved from the vector memory 1202 corresponds to data that is to be received from the DUT pin 110, then the compare-data formatter 1216 formats a waveform using the waveform data and timing information (provided by the waveform table 708 and the edge generator 1208, respectively). The compare-data formatter 1216 then provides the formatted waveform to the error detector 1218. The error detector 1218 compares the formatted waveform to a corresponding waveform received from the DUT pin 110. Differences between the formatted waveform and the corresponding waveform received form the DUT pin 110 represent errors in the performance of the DUT 106. Information about such errors is stored in the error map 1220.

It should be emphasized that the above-described embodiments are merely possible examples, among others, of the implementations. Many variations and modifications may be made to the above-described embodiments. All such modifi-

What is claimed is:

1. A method for adaptively compressing test data to be provided to a device under test (DUT), the method comprising the steps of:
examining a test data file that includes test data configured to enable testing the DUT, the test data file including a first plurality of data units and a second plurality of data units, the first plurality of data units corresponding to a first plurality of DUT pins, and the second plurality of data units corresponding to a second plurality of DUT pins, wherein the first plurality of DUT pins are clock-pins and the second plurality of DUT pins are non-clock-pins;
determining that the first plurality of data units have a first compressibility characteristic; and
determining that the second plurality of data units have a second compressibility characteristic.

2. The method of claim 1, further comprising the step of: compressing the first plurality of data units independently from the second plurality of data units.

3. The method of claim 1, wherein the test data file is one of a STIL (standard test interface language) file and a WGL (waveform generation language) file.

4. The method of claim 1, wherein the first plurality of data units have a different timing complexity, a different vector data volume, and more repetitive data patterns than the second plurality of data units.

5. A system for adaptively compressing test data to be provided to a device under test (DUT), the system comprising:
memory configured to store a test data file that includes test data configured to enable testing the DUT, the test data file including a first plurality of data units and a second plurality of data units, the first plurality of data units corresponding to a first plurality of DUT pins, and the second plurality of data units corresponding to a second plurality of DUT pins, wherein the first plurality of DUT pins are clock-pins and the second plurality of DUT pins are non-clock-pins; and
a processor that is operative to:
determine that the first plurality of data units have a first compressibility characteristic;
determine that the second plurality of data units have a second compressibility characteristic.

6. The system of claim 5, wherein the processor is operative to:
compress the first plurality of data units independently from the second plurality of data units.

7. The system of claim 5, wherein the test data file is one of a STIL (standard test interface language) file and a WGL (waveform generation language) file.

8. The system of claim 5, wherein the first plurality of data units have a different timing complexity, a different vector data volume, and more repetitive data patterns than the second plurality of data unit.

* * * * *